United States Patent
Dahal et al.

(10) Patent No.: US 9,922,838 B2
(45) Date of Patent: Mar. 20, 2018

(54) SELECTIVE, ELECTROCHEMICAL ETCHING OF A SEMICONDUCTOR

(71) Applicant: RENSSELAER POLYTECHNIC INSTITUTE, Troy, NY (US)

(72) Inventors: Rajendra P. Dahal, Troy, NY (US); Ishwara B. Bhat, Clifton Park, NY (US); Tat-Sing Chow, Niskayuna, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 15/116,041

(22) PCT Filed: Feb. 10, 2015

(86) PCT No.: PCT/US2015/015112
§ 371 (c)(1),
(2) Date: Aug. 2, 2016

(87) PCT Pub. No.: WO2015/120424
PCT Pub. Date: Aug. 13, 2015

(65) Prior Publication Data
US 2017/0170025 A1    Jun. 15, 2017

Related U.S. Application Data

(60) Provisional application No. 61/937,736, filed on Feb. 10, 2014.

(51) Int. Cl.
*H01L 21/3063* (2006.01)
*H01L 21/465* (2006.01)
(Continued)

(52) U.S. Cl.
CPC .... *H01L 21/30635* (2013.01); *H01L 21/3063* (2013.01); *H01L 21/3228* (2013.01); *H01L 21/465* (2013.01); *H01L 29/00* (2013.01)

(58) Field of Classification Search
CPC .......... H01L 21/30635; H01L 21/3063; H01L 21/3228
See application file for complete search history.

(56) References Cited

U.S. PATENT DOCUMENTS 5,454,915 A    10/1995    Shor et al.
6,803,637 B2   10/2004    Benzel et al.
(Continued)

FOREIGN PATENT DOCUMENTS

WO    1995032524 A1     11/1995
WO    2011094391 A1      8/2011
WO    WO 2011/094391 A1  8/2011

OTHER PUBLICATIONS

International Search Report & Written Opinion issued in PCT/US2015/015112, dated May 15, 2015.
(Continued)

*Primary Examiner* — Errol Fernandes
(74) *Attorney, Agent, or Firm* — Kevin P. Radigan, Esq.; Heslin, Rothenberg Farley & Mesiti P.C.

(57) ABSTRACT

Methods for facilitating fabricating semiconductor structures are provided which include: providing a multilayer structure including a semiconductor layer, the semiconductor layer including a dopant and having an increased conductivity; selectively increasing, using electrochemical processing, porosity of the semiconductor layer, at least in part, the selectively increasing porosity utilizing the increased conductivity of the semiconductor layer; and removing, at least in part, the semiconductor layer with the selectively increased porosity from the multilayer structure. By way of example, the selectively increasing porosity may include selectively, anodically oxidizing, at least in part, the semiconductor layer of the multilayer structure.

18 Claims, 9 Drawing Sheets

(51) Int. Cl.
*H01L 29/00* (2006.01)
*H01L 21/322* (2006.01)

(56) References Cited

U.S. PATENT DOCUMENTS

2003/0045120 A1  3/2003  Hu et al.
2005/0059219 A1  3/2005  Tayanaka
2013/0207237 A1  8/2013  Weisbuch et al.
2014/0003458 A1  1/2014  Han

OTHER PUBLICATIONS

Supplemental European Search Report for EP Application No. 15745915.7, dated Aug. 7, 2017 (4 pages).

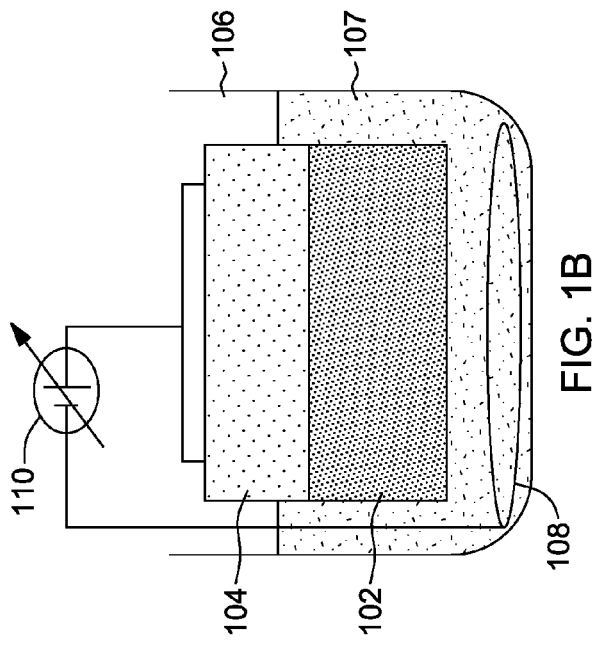
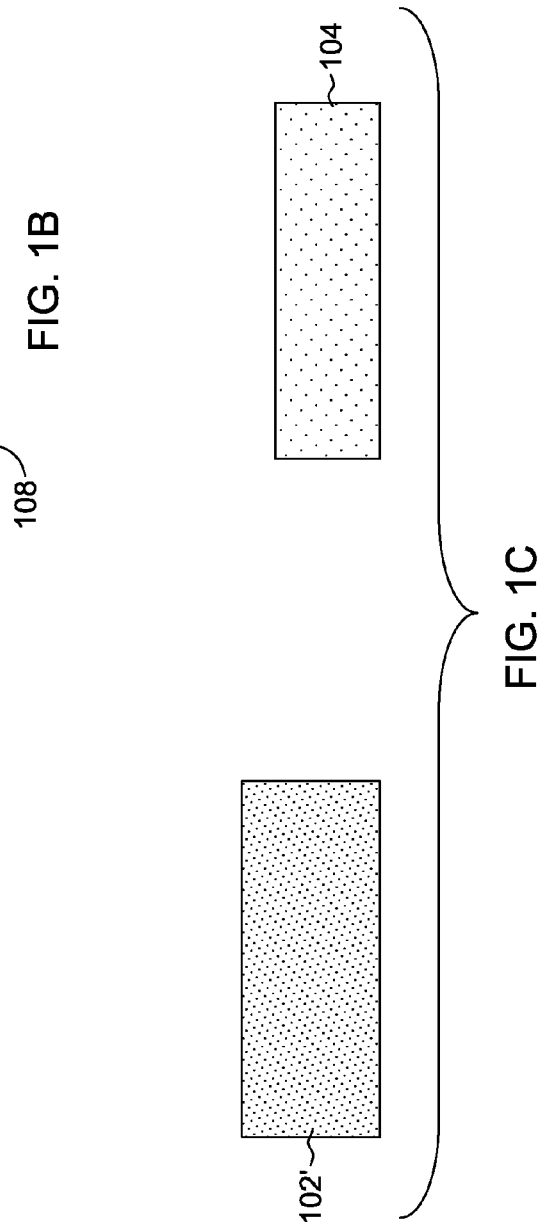
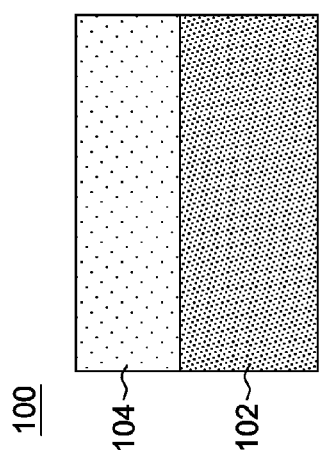
FIG. 1A
FIG. 1B
FIG. 1C

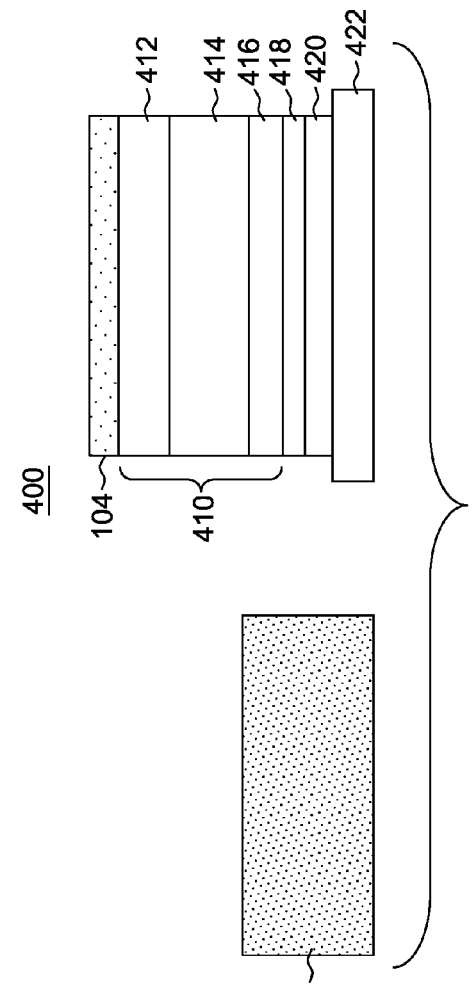
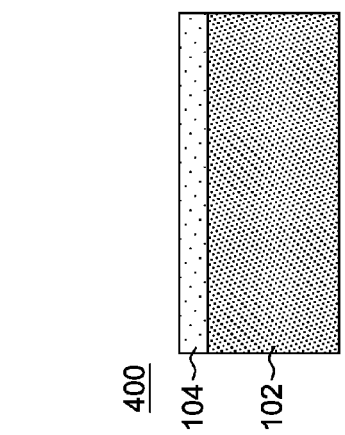
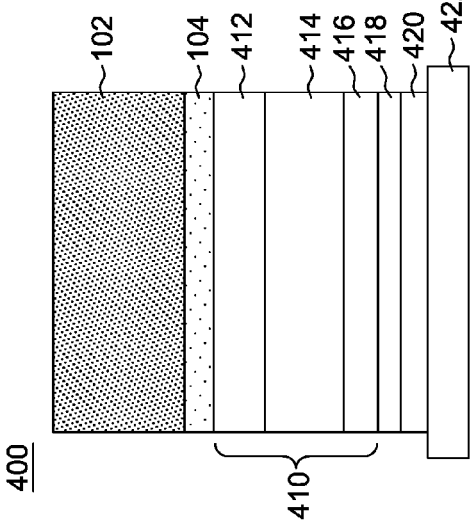
FIG. 4A   FIG. 4B   FIG. 4C   FIG. 4D   FIG. 4E

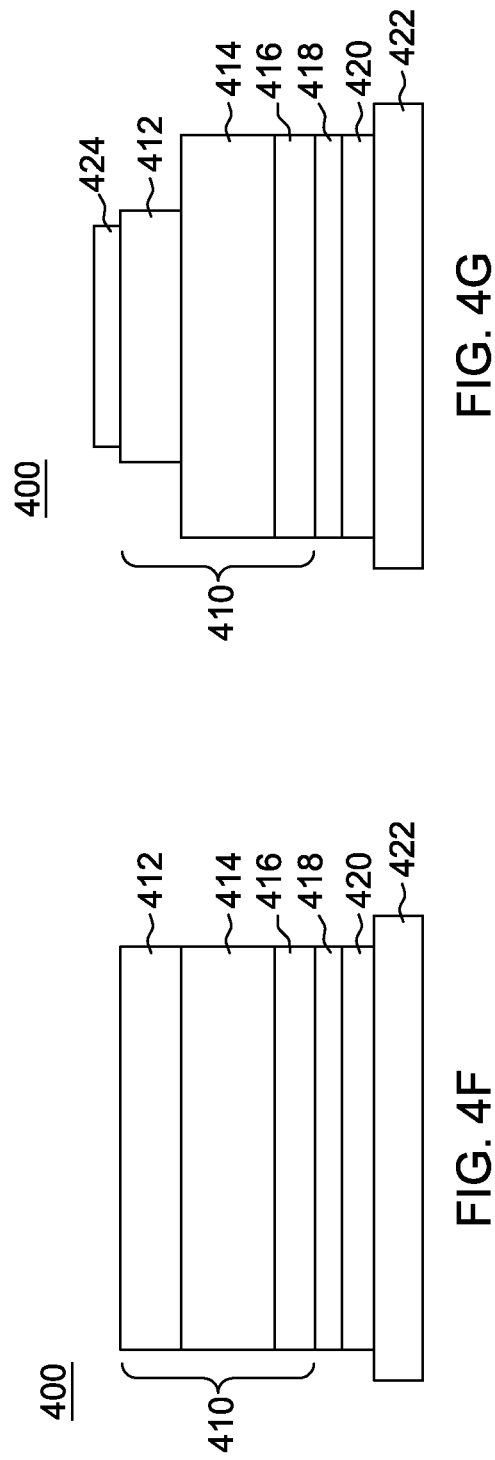

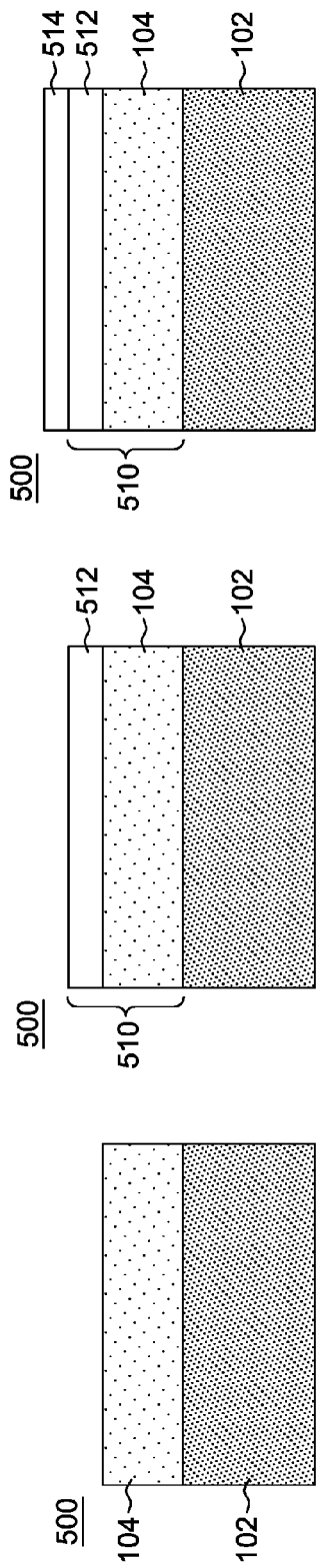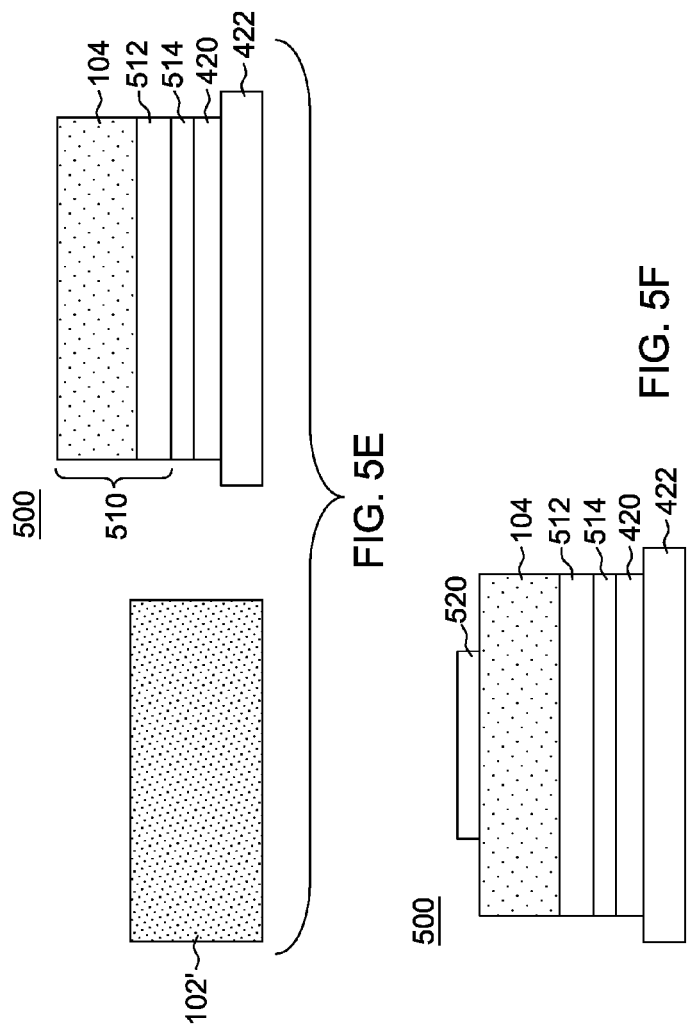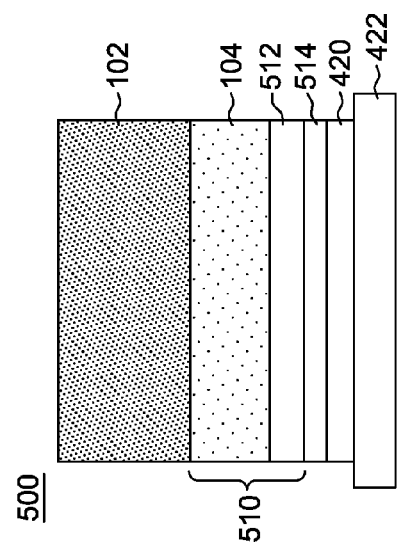

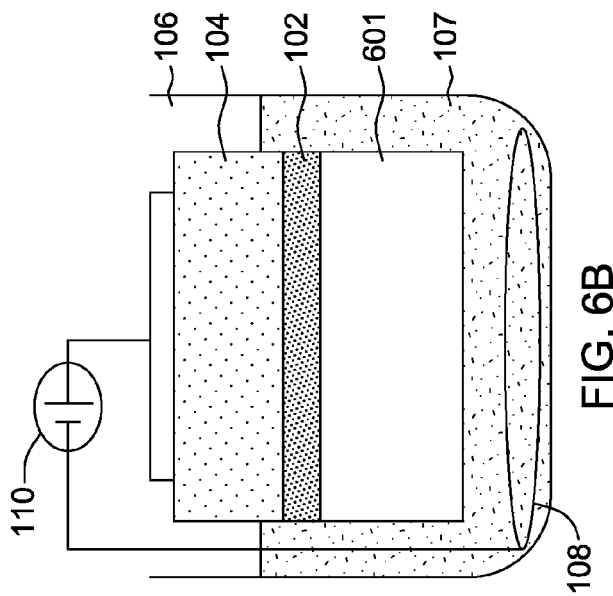
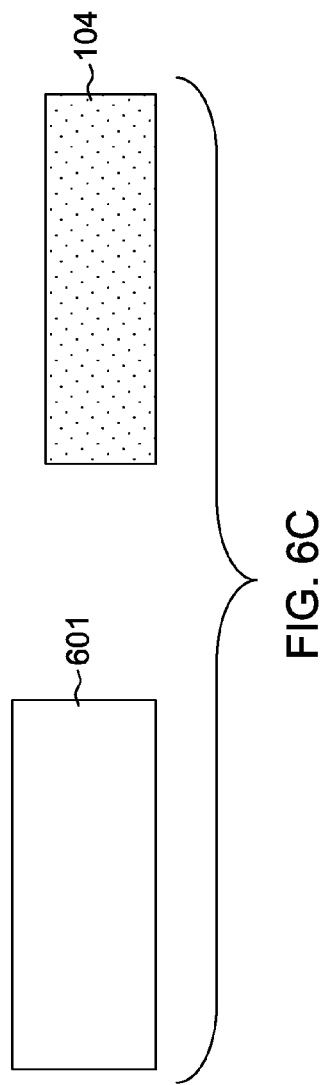
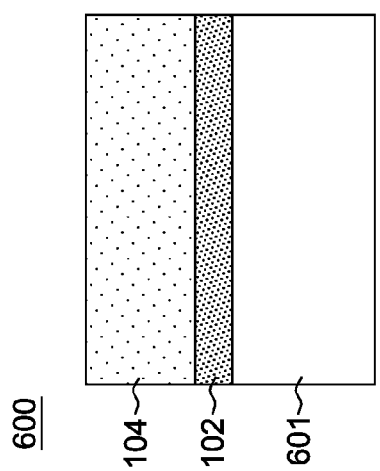
FIG. 6A
FIG. 6B
FIG. 6C

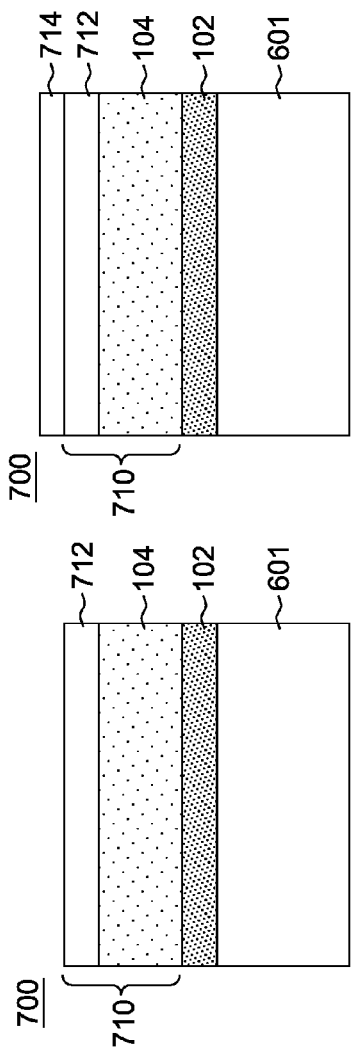
FIG. 7A
FIG. 7B
FIG. 7C
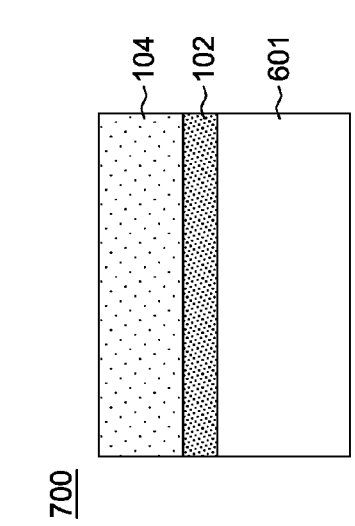
FIG. 7D
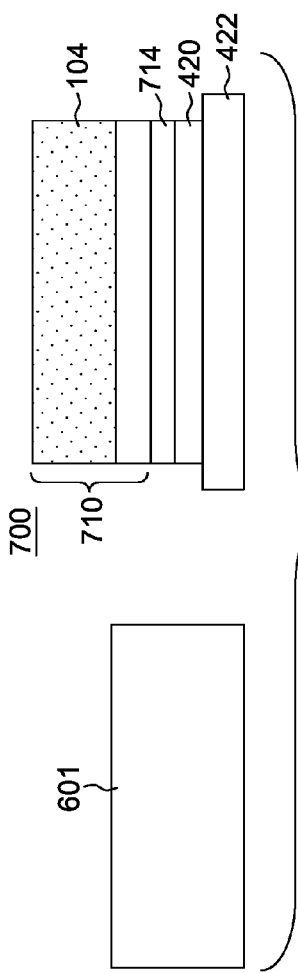
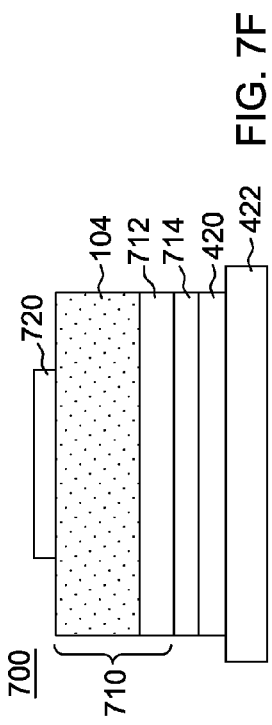
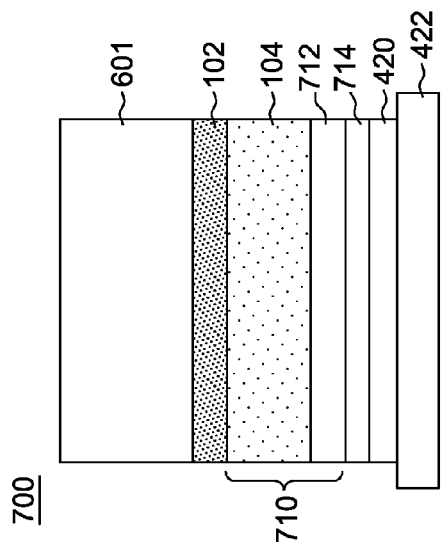
FIG. 7E
FIG. 7F

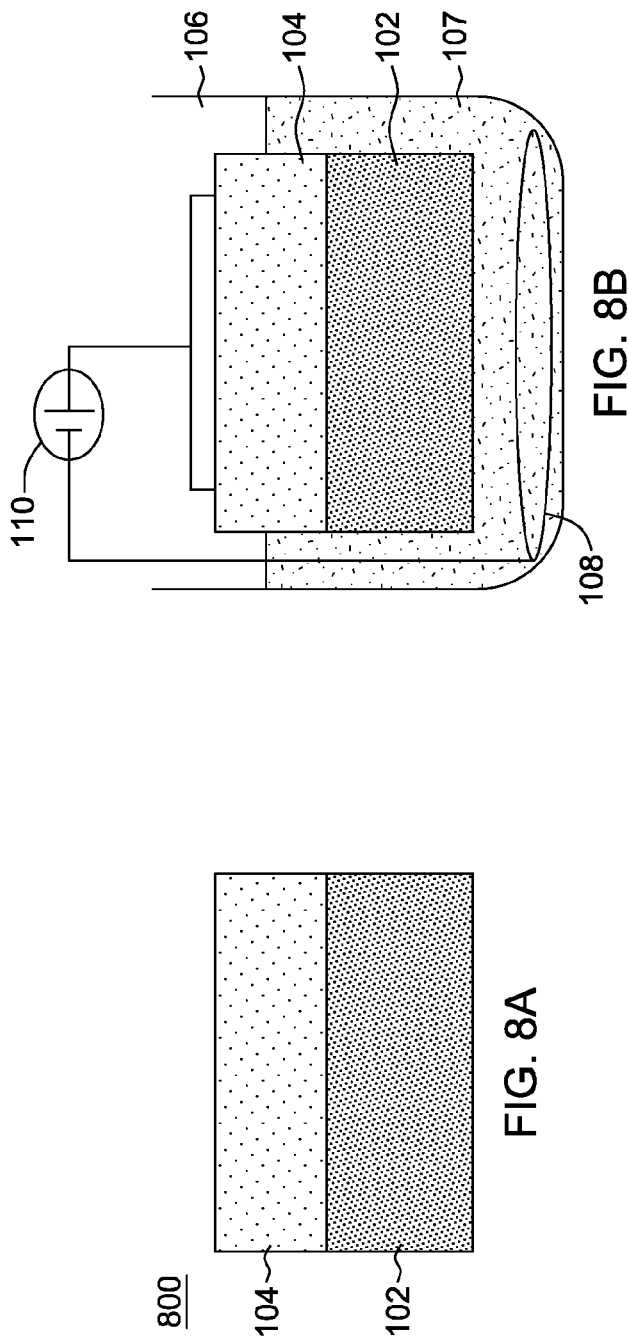

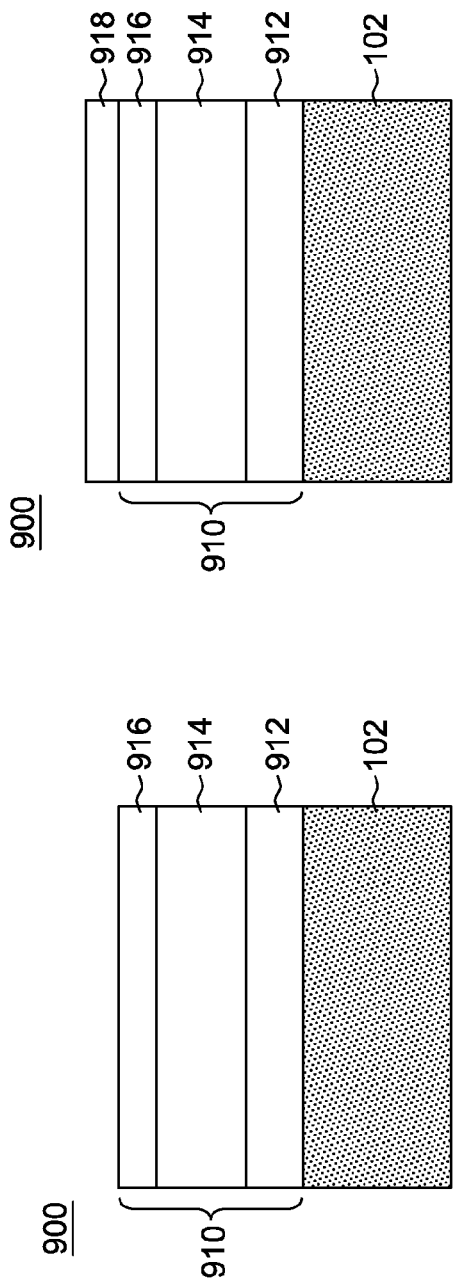
FIG. 9A
FIG. 9B
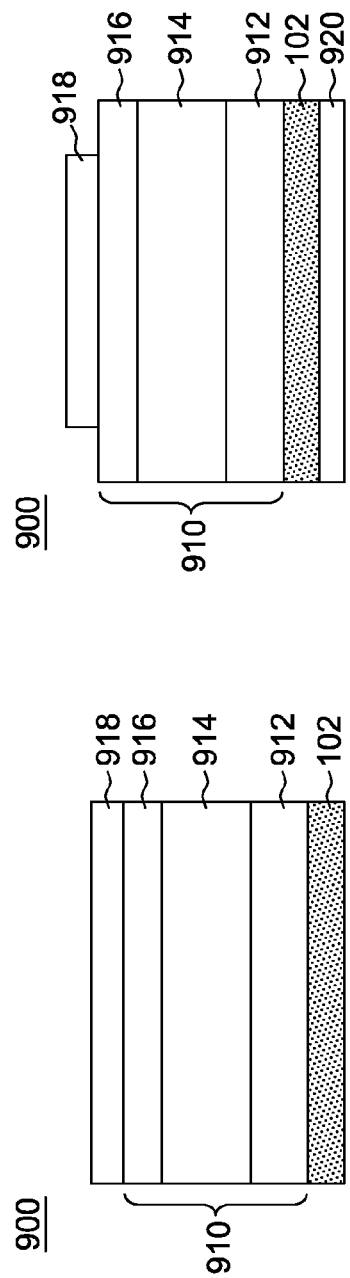
FIG. 9C
FIG. 9D

US 9,922,838 B2

SELECTIVE, ELECTROCHEMICAL ETCHING OF A SEMICONDUCTOR

CROSS-REFERENCE TO RELATED APPLICATION

This application claims the benefit of PCT Application No. PCT/US2015/015112, filed Feb. 10, 2015, which published Aug. 13, 2015, as PCT Publication No. WO 2015/120424 A1, and which claims the benefit of U.S. Provisional Patent Application No. 61/937,736, filed Feb. 10, 2014. Each of these applications is hereby incorporated herein by reference in its entirety.

STATEMENT REGARDING FEDERALLY SPONSORED RESEARCH OR DEVELOPMENT

This invention was made with United States Government support under Contract Number DE-AR0000304, awarded by the Advanced Research Projects Agency—Energy (ARPA-E) of the United States Government. The United States Government has certain rights in the invention.

BACKGROUND

Advances in the semiconductor industry continue to be desired to address demand for semiconductor devices capable of high performance and low power consumption in a wide variety of applications. In one or more applications, enhanced high-voltage semiconductor devices such as, enhanced Schottky diodes, p-i-n diodes, insulated-gate bipolar transistors (IGBT), bipolar junction transistors (BJTs), etc., may be desired for, for instance, high-speed power switching applications.

By way of example, high-voltage semiconductor devices may be fabricated on relatively thick semiconductor substrates, which are provided for structural support of the semiconductor devices during fabrication. Disadvantageously, such relatively thick semiconductor substrates may contribute to performance issues in the final device, such as low carrier mobility in the semiconductor substrates, resulting, for instance, in excessive heating or even overheating the semiconductor device(s).

Therefore, further enhancements in fabrication techniques for semiconductor devices, such as high-power devices, continue to be desired.

BRIEF SUMMARY

The shortcomings of the prior art are overcome and additional advantages are provided through the provision, in one aspect, of a method which includes: providing a multilayer structure comprising a semiconductor layer, the semiconductor layer including a dopant, and having an increased conductivity; selectively increasing, using electrochemical processing, porosity of the semiconductor layer, at least in part, the selectively increasing porosity utilizing the increased conductivity of the semiconductor layer; and removing, at least in part, the semiconductor layer with the selectively increased porosity from the multilayer structure.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 1A-1C depict one embodiment of an electrochemical process for selectively increasing porosity of a first semiconductor layer to, for instance, facilitate removing the first semiconductor layer from a second semiconductor layer, in accordance with one or more aspects of the present invention;

FIGS. 4A-4G depict one embodiment of a process for fabricating an exemplary semiconductor structure utilizing, for instance, the selective semiconductor layer removal processing of FIGS. 1A-1C, in accordance with one or more aspects of the present invention;

FIGS. 5A-5F depict one embodiment of a process for fabricating another semiconductor structure utilizing, for instance, the selective semiconductor layer removal processing of FIGS. 1A-1C, in accordance with one or more aspects of the present invention;

FIGS. 6A-6C depict one embodiment of an electrochemical process for selectively increasing porosity of a semiconductor layer to facilitate separating a semiconductor substrate from a multilayer structure, in accordance with one or more aspects of the present invention;

FIGS. 7A-7F depict one embodiment of a process for fabricating a semiconductor structure utilizing, in part, the selective semiconductor layer removal processing of FIGS. 6A-6C, in accordance with one or more aspects of the present invention;

FIGS. 8A-8C depict one embodiment of an electrochemical process for selectively increasing porosity of a semiconductor substrate of a multilayer structure to thin the semiconductor substrate, in accordance with one or more aspects of the present invention; and FIGS. 9A-9D depict one embodiment of a process for fabricating a semiconductor structure using, in part, the selective semiconductor substrate thinning processing of FIGS. 8A-8C, in accordance with one or more aspects of the present invention.

DETAILED DESCRIPTION

Figure 3:
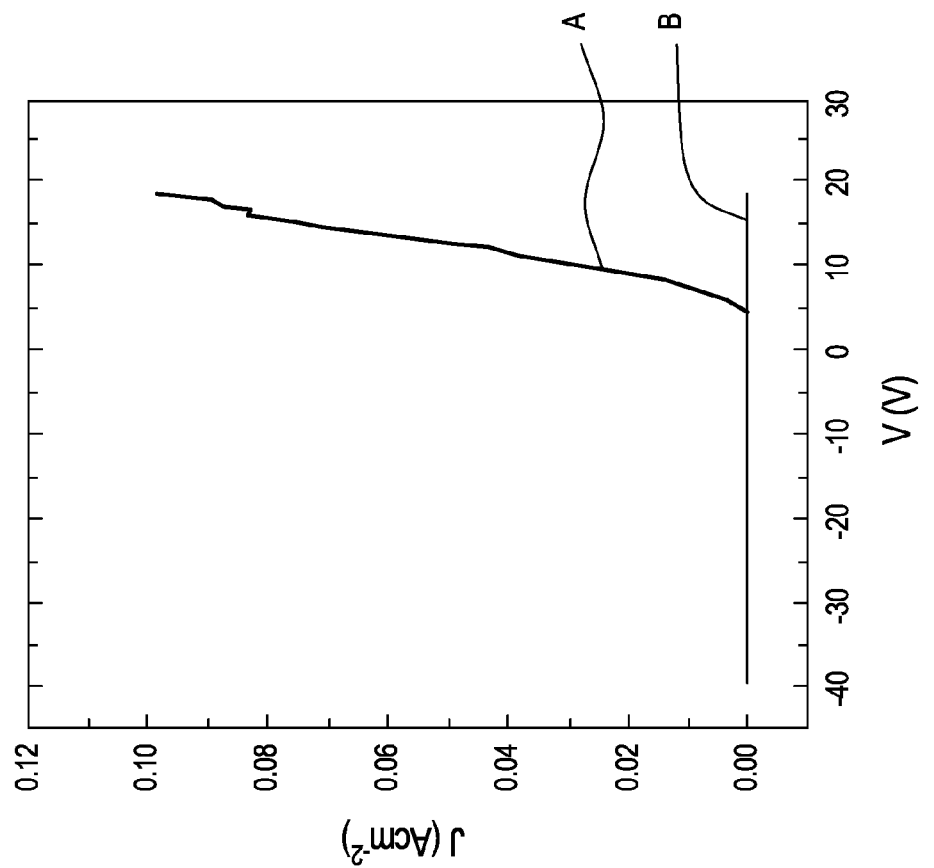
FIG. 3 is a current density-voltage profile graph obtained during electrochemically processing of a semiconductor layer, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

In one or more specific implementations, disclosed herein are methods for selectively removing heavily doped semiconductor layers such as, silicon carbide (SiC) substrates, from high-voltage power devices, such as, Schottky diodes, p-i-n diodes, etc., by selectively increasing, using electrochemical processing, porosity of the heavily doped semiconductor layer(s). Conventionally, and as noted, high-voltage semiconductor devices such as, Schottky diodes, p-i-n diodes, insulated-gate bipolar transistors (IGBTs), bipolar junction transistors (BJTs), etc., have been fabricated on relatively thick semiconductor substrates, such as a relatively thick monocrystalline silicon semiconductor wafer. By way of enhancement, wide-bandgap semiconductor materials, such as, III-V and/or II-VI compounds (e.g., silicon carbide (SiC), gallium nitride (GaN), etc.), may be used to increase speed of the semiconductor devices being fabricated. For instance, wide-bandgap semiconductor materials such as, silicon carbide and/or gallium nitride may be desirable to enhance transistor performance, owing to their relatively wide-bandgap, high breakdown field strength, high electron mobility, and high thermal conductivity characteristics. Advantageously, high-power semiconductor devices formed on such semiconductor materials may operate at higher temperatures, higher power levels and/or with lower specific on-resistance, thereby improving transistor performance and efficiency.

The removal of a wide-bandgap semiconductor substrate, such as a silicon carbide or gallium nitride substrate, from an epitaxial silicon carbide or gallium nitride layer, respectively, without introducing degradation in crystalline quality and transport properties of the epitaxial layer, is believed to be particularly advantageous to fabrication of bipolar power devices on both sides of the epitaxial silicon carbide or gallium nitride layer. However, the removal of a thick, wide-bandgap substrate, for instance, with a thickness of 350 microns or greater, from the epitaxial layer, is not straightforward. For instance, silicon carbide and gallium nitride crystal are hard substrates, and hence a mechanical-polishing rate for these substrates would be very slow. For example, chemical-mechanical polishing of a silicon carbide or gallium nitride crystal substrate may proceed at a rate of only a few microns per hour. Faster grinding is possible, but may introduce mechanical stress on the epitaxial film and eventually break the epitaxial film, which limits wafer size for processing using this approach. Further, with this structure, there is no obvious 'etch stop' layer at the interface of the epitaxial layer and substrate to stop the mechanical polishing process. In addition, the wafer may have a curvature after the epitaxial layer growth, and hence the polishing rate may not be uniform over the full wafer.

Further, with a silicon carbide substrate, the epitaxial growth of silicon carbide on a C-face substrate is not straightforward compared to epitaxial growth on a Si-face substrate. Advantageously, the epitaxial silicon carbide layer that is released from the silicon carbide substrate using the processing disclosed herein has both C and Si faces of high-quality, which are ready for further device fabrication. Therefore, by growing silicon carbide film on an Si-face silicon carbide substrate, and then releasing the epitaxial silicon carbide film from the substrate, a high-quality, C-face epitaxial layer is advantageously obtained for device fabrication.

The present disclosure provides (in one or more aspects) techniques for selectively removing heavily doped semiconductor layers such as, silicon carbide (SiC) substrates, from lightly-doped epitaxially-grown semiconductor layers by, for instance, selectively increasing porosity of the heavily doped semiconductor layers using electrochemical processing thereof. The methods disclosed herein advantageously facilitate enhancing crystallinity of the epitaxially-grown semiconductor layers, which may be used to fabricate high-voltage power devices such as, Schottky diodes, p-i-n diodes, IGBTs, BJTs, etc. Further, the lightly-doped, epitaxially-grown semiconductor layers may be employed to fabricate devices on any available crystalline face of the epitaxially-grown semiconductor layers. Additionally, once removed, the heavily-doped semiconductor layers of increased porosity may be used for a variety of purposes, including, for instance, in fabricating highly efficient gas sensors, molecular filters, electrodes for electron field emitters, etc.

Thus, generally stated, disclosed herein, in one or more aspects, are methods for facilitating fabricating a semiconductor structure which include, for instance: providing a multilayer structure including a semiconductor layer, the semiconductor layer comprising a dopant, and having an increased conductivity; selectively increasing, using electrochemical processing, porosity of the semiconductor layer, at least in part, the selectively increasing porosity utilizing the increased conductivity of the semiconductor layer; and removing, at least in part, the semiconductor layer with the selectively increased porosity from the multilayer structure.

In one or more embodiments, the selectively increasing porosity includes anodically oxidizing, at least in part, the semiconductor layer. For instance, the selectively increasing porosity may include electrochemically processing the semiconductor layer within an electrolytic solution comprising an inorganic acid and an oxidizing species to selectively, anodically oxidize, at least in part, the semiconductor layer, the dopant of the semiconductor layer enhancing the anodically oxidizing thereof to selectively increase the porosity of the semiconductor layer and facilitate the removing, at least in part, of the semiconductor layer from the multilayer structure. The electrochemically processing may include controlling a current density applied through the electrolytic solution and the semiconductor layer, with the selectively increasing porosity being, at least in part, a function of the current density applied.

In one or more implementations, the semiconductor layer is a first semiconductor layer, and the method further includes epitaxially growing a second semiconductor layer over the first semiconductor layer, prior to the selectively increasing porosity of the first semiconductor layer. By way of example, the first semiconductor layer and the second semiconductor layer may each comprise a wide-bandgap semiconductor material. For instance, the first semiconductor layer and the second semiconductor layer may each comprise silicon carbide or a silicon carbide alloy. Alternatively, the first semiconductor layer and the second semiconductor layer could each comprise gallium nitride or a gallium nitride alloy.

In certain embodiments, the increased conductivity of the first semiconductor layer may be a first conductivity, and the second semiconductor layer may have a second conductivity, with the first conductivity of the first semiconductor layer being greater than the second conductivity of the second semiconductor layer, and the anodically oxidizing of the first semiconductor layer may utilize the greater conductivity of the first semiconductor layer to selectively increase porosity of the first semiconductor layer, at least in part, without increasing porosity of the second semiconductor layer. By way of example, the first conductivity of the first semiconductor layer may be ten times greater or more than the second conductivity of the second semiconductor layer.

In one or more embodiments, providing the multilayer structure may include providing the semiconductor layer as a semiconductor substrate, with the selectively increasing porosity facilitating removing, at least in part, the semiconductor substrate. With this approach, the the method may further include providing a multilayer semiconductor device above the semiconductor layer prior to the selectively increasing porosity thereof. By way of example, the multilayer semiconductor device may be or include a diode, such as a p-i-n diode or a Schottky diode.

In one or more other embodiments, providing the multilayer structure may include providing the semiconductor layer above a semiconductor substrate, and the selectively increasing porosity may facilitate removing the semiconductor substrate from the multilayer structure. In addition, providing the multilayer structure may include providing a multilayer semiconductor device above the semiconductor layer, prior to the selectively increasing porosity thereof. In one or more implementations, the method may include bonding the multilayer structure to a support substrate prior to the removing of the semiconductor substrate of the multilayer structure. In one or more further embodiments, the removing may comprise only partially removing the semiconductor layer from the multilayer structure, leaving the thinned semiconductor layer as part of the multilayer structure. In combination with these embodiments, providing the multilayer structure may also include providing a multilayer semiconductor device above the semiconductor layer. Also, the providing of the multilayer structure may include providing the semiconductor layer as a semiconductor substrate of the multilayer structure, with the thinned semiconductor layer being a thinned semiconductor substrate of the multilayer structure.

Reference is made below to the drawings, which are not drawn to scale for ease of understanding, wherein the same reference numbers used throughout different figures designate the same or similar layers or components.

As noted, in one or more aspects, disclosed herein are methods for selectively etching heavily-doped, wide-bandgap semiconductors, such as heavily-doped, n-type wide-bandgap semiconductors, including silicon carbide and gallium nitride, and their alloys, by making the semiconductor material porous, using an electrochemical etching (ECE) process, without any ultraviolet illumination. In the ECE process, the multilayer structures (comprising, for instance, silicon carbide or gallium nitride wafers having two or more layers with different conductivities), serve as the working electrode, and for instance, a platinum (Pt) wire is provided as a counter-electrode. In the electrolyte cell, the working electrode may be positively biased; however, the junction between the heavily-doped silicon carbide or gallium nitride substrate and the electrolyte is reverse-biased. When the applied voltage is greater than the breakdown voltage of the Schottky junction (e.g., 5-20 volts) current can flow, and the heavily-doped silicon carbide or gallium nitride layer(s) becomes selectively porous via oxide formation, and subsequently separates and dissolves (in one embodiment) within the electrolyte. In this approach, a mixture of inorganic acids with an oxidizing agent may be used as the electrolyte. For instance, with oxide-dissolving acid as the electrolyte, silicon carbide becomes porous, and 50-100 micron thick (or greater) porous silicon carbide can peel off from the substrate as a single layer. In one or more implementations, this self-peeling process is related to large stress development in the porous silicon carbide due to the lattice mismatch. The process may be repeated until, for instance, substantially all highly-conducting, wide-bandgap substrate material is separated and consumed. Advantageously, this process is self-limited at the interface of the highly-conducting substrate and epitaxial layer (with lower conductivity). Further, if the highly-conductive layer is embedded in-between, for instance, a semi-insulating substrate and lightly-doped epitaxial layer, then the semi-insulating substrate and lightly-doped epitaxial layers may be separated by making the embedded conducting layer porous via the ECE process described. This advantageously facilitates potential reuse of an expensive, semi-insulating silicon carbide or gallium nitride substrate after removal of the epitaxial layer(s) for device fabrication.

By way of example, FIGS. 1A-1C depict one embodiment of a process for selectively increasing, using electrochemical processing, porosity of a first semiconductor layer to, for instance, facilitate removing (at least in part) the first semiconductor layer from a second semiconductor layer, in accordance with one or more aspects of the present invention.

FIG. 1A illustrates one embodiment of an intermediate multilayer structure 100 obtained during fabrication of a semiconductor device, such as, a high-voltage power device (e.g., IGBT or BJT device, Schottky or p-i-n diode, etc.), in accordance with one or more aspects of the present invention. As shown, semiconductor structure 100 includes a first semiconductor layer 102 and a second semiconductor layer 104 disposed over first semiconductor layer 102. In one or more implementations, first semiconductor layer 102 comprises a higher-doped, higher-conducting $n^+$ layer, and second semiconductor layer 104 is a lower-doped, lower-conducting $n^-$ layer.

More particularly, in one or more embodiments, first semiconductor layer 102 may be a semiconductor substrate, such as a bulk semiconductor material. For instance, first semiconductor layer 102 may be or include a wide-bandgap semiconductor material, such as, a III-V and/or II-VI compound (e.g., silicon carbide (SiC), gallium nitride (GaN), etc.), and may be doped with n-type dopant or a p-type dopant. Note that, as used herein, a wide-bandgap semiconductor material refers a semiconductor material having bandgap energy greater than about 1 eV. By way of example only, first semiconductor layer 102 is assumed to be implanted with a high concentration of n-type dopants to create a high-conducting $n^+$ semiconductor layer 102 (alternatively referred to herein as $n^+$ substrate 102 or $n^+$ layer 102, depending on the implementation). Note that n-type doping refers to the addition of n-type dopant impurities to, for instance, intrinsic (undoped) semiconductor material. The impurities contribute more electrons to the intrinsic material, in part, defining the electrical conductivity of the doped semiconductor layer. Examples of possible n-type dopants include (for instance) phosphorus, arsenic or antimony. In one example, a silicon carbide semiconductor layer may be implanted with, for instance, n-type dopants using one or more ion implantation process(es) and/or diffusion process(es) to provide a desired concentration of n-type dopants within the $n^+$ substrate 102. In a specific example, the concentration of n-type dopants implanted within $n^+$ substrate 102 may be about $10^{17}$ atoms/cm$^3$ or more, which as noted, increases the electrical conductivity of the substrate. The thickness of $n^+$ substrate 102 is sufficient to provide structural stability to second semiconductor layer 104, and in certain embodiments, to additional semiconductor device layers formed during subsequent device processing. In one example, the thickness of $n^+$ substrate 102 may be within a range of about 300 to 600 microns, or more. Note that alternatively, the substrate may be implanted with p-type dopants to create a highly-conducting p⁺ substrate, if desired for a particular application.

As noted, multilayer structure 100 also includes second semiconductor layer 104 in this example, which may be epitaxially grown or deposited over n⁺ substrate 102. For instance, in one or more embodiments, second semiconductor layer 104 may be an epitaxial single crystalline semiconductor layer. The material of second semiconductor layer 104 may be similar to the material of n⁺ substrate 102, and may be formed (for example) by various epitaxial growth processes such as, ultra-high vacuum chemical vapor deposition (UHV-CVD), molecular beam epitaxy (MBE) or the like. Further, note that second semiconductor layer 104 may also be implanted with n-type dopants, but at a lower concentration, to create a lower-conducting n⁻ semiconductor layer (alternatively referred to herein as n⁻ epi layer 104). By way of example, the concentration of n-type dopants implanted within n⁻ epi layer 104 may be about $10^{16}$ atoms/cm³ or less, which as noted, defines the conductivity of the n⁻ epi layer 104. One skilled in the art will thus understand that n⁺ substrate 102 is heavily doped with n-type dopants compared with n⁻ epi layer 104 with, for instance, the conductivity of n⁺ substrate 102 being about ten times greater or more than the conductivity of n⁻ epi layer 104 (by way of example).

As illustrated in FIG. 1B, multilayer structure 100, and in particular n⁺ substrate 102, may be subjected to electrochemical processing, in accordance with one or more aspects of the present invention. By way of example, the electrochemical processing of n⁺ substrate 102 may be accomplished utilizing, for instance, an electrolytic solution 107 disposed within an electrochemical cell 106, and in particular, an anodic cell, into which multilayer structure 100 is immersed or at least partially submerged, along with a conducting electrode 108. Note that, in one embodiment, multilayer structure 100, comprising n⁺ substrate 102 and n⁻ epi layer 104, serves as the working electrode, while conducting electrode 108 (which, for instance, may be or include a metal such as, platinum) serves as the counter electrode. In one embodiment, electrolytic solution 107 may be a liquid through which electricity may pass, and may include an inorganic acid and an oxidizing species. In a specific example, the inorganic acid may be or include an acid such as, hydrofluoric acid (HF) (for SiL or GaN removal), or hydrochloric acid (HCl) (for GaN removal), while oxidizing species may be or include an oxygen-containing oxidizing agent such as, hydrogen peroxide ($H_2O_2$) or potassium nitrate ($KNO_2$). Multilayer structure 100 may be electrically connected to conducting electrode 108 using, for instance, a power supply 110, which biases the structure, and in particular, n⁺ substrate 102, to a desired bias voltage with respect to the conducting electrode 108 such that n⁺ substrate 102 may be anodically etched.

By way of example, multilayer structure 100, containing n⁺ substrate 102, may be is positively biased by power supply 110, while the junction between n⁺ substrate 102 and electrolytic solution 107 is reverse biased. When the applied voltage is greater than the breakdown voltage of the Schottky junction, current flow may be directional, for instance, from electrolytic solution 107 to n⁺ substrate 102, resulting in anodic oxidation of the exposed surface thereof. Assuming n⁺ substrate 102 is an n⁺ silicon carbide layer, then in one example, an exposed surface of n⁺ substrate 102 may be oxidized to form silicon oxide and carbon dioxide. Such oxidation advantageously increases porosity of the surface of n⁺ substrate 102 due, for instance, to depletion of mobility carriers owing to the Schottky diode effect. Note that, as discussed above, the greater conductivity of n⁺ substrate 102 as compared to the conductivity of n⁻ epi layer 104 allows the current to pass selectively through the substrate, thereby changing porosity of n⁺ substrate 102 without changing or significantly changing porosity of n⁻ epi layer 104. Note that, in one or more embodiments, the thickness of the oxidized surface of n⁺ substrate 102 may be controlled by controlling the current density applied through electrolytic solution 107. This, in turn, facilitates controlling the increase in porosity of the oxidized surface, with the increasing porosity of n⁺ substrate 102 being, at least in part, a function of the current density applied through the electrolytic solution. In one or more implementations, the current density applied may be in the range of 0.1 A/cm² to 1 A/cm², or more.

As noted, the electrochemical processing of n⁺ substrate 102 may induce an intrinsic stress within the oxidized porous surface/layer of n⁺ substrate 102 due to, for instance, a lattice mismatch between the oxidized and unoxidized portions of n⁺ substrate 102. The intrinsic stress within the oxidized porous surface may reach a desired critical value resulting, for instance, in the oxidized porous layer peeling off from the unoxidized portion of n⁺ substrate 102, and in one or more embodiments, subsequently dissolving in electrolytic solution 107. Although the rate of removal of the oxidized porous portion from the unoxidized portion of n⁺ substrate may depend on process parameters such as, current density applied, concentration of inorganic acid in the electrolytic solution and/or oxidizing time, the rate of removal of the oxidized porous portion, in one example, may be about 200 μm/hr or more, which is significantly faster than substrate removal using a chemical-mechanical polishing approach. Note also that electrochemical processing of the n⁺ substrate to increase porosity and peeling-off the oxidized porous portion may continue in one or more iterative cycles, for instance, until the n⁺ substrate is consumed completely and/or the oxidized porous n⁺ substrate reaches a critical thickness, allowing the porous n⁺ substrate 102' to be completely removed from n⁻ epi layer 104, as depicted in FIG. 1C. In one example, the critical thickness of porous n⁺ substrate 102' may be within a range of about 50 to 100 μm, or more. Note that, as depicted, the n⁻ epi layer 104 remains unaffected during the electrochemical processing of the n⁺ substrate resulting, for instance, in a free-standing epitaxially grown n⁻ epi layer 104. Advantageously, this free-standing n⁻ epi layer 104 may used to fabricate enhanced semiconductor devices, for instance, electronic devices or optoelectronic devices, on any available crystalline surface (e.g., Si- or C-face of silicon carbide material, or Ga- or N-face of gallium nitride material) of n⁻ epi layer 104. Additionally, the free-standing epitaxially grown n⁻ epi layer 104 may itself be used as a semiconductor substrate to fabricate high-voltage power devices such as, p-i-n diodes, Schottky diodes, IGBT devices, etc., as discussed herein. In such applications, the thinner semiconductor substrate layer may advantageously facilitate better heat dissipation during operation of the high-power device(s). Furthermore, the porous n⁺ substrate 102' may advantageously be reused for other applications such as, for instance, in fabricating highly efficient gas sensors, molecular filters, electrodes for electron field emitters, etc.

Figure 2:
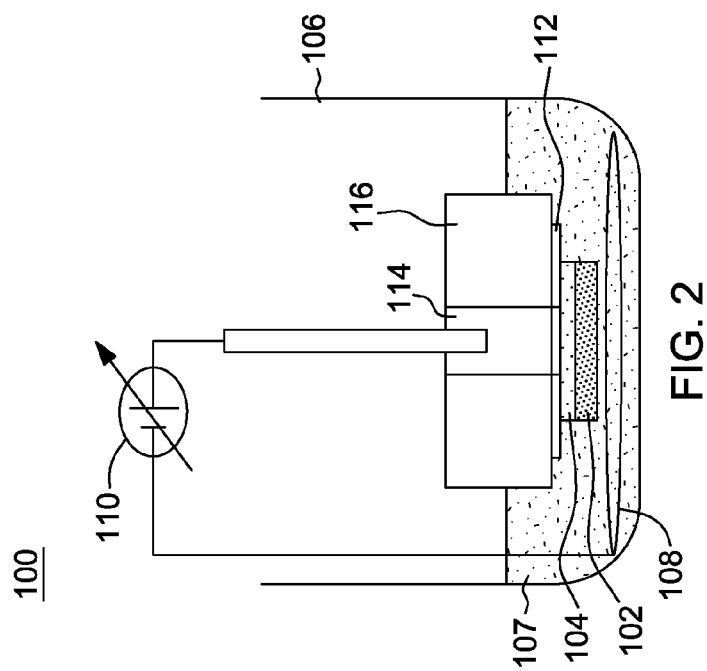
FIG. 2 is an alternate depiction of the assembly of FIG. 1B to electrochemically process the first semiconductor layer within an electrolytic solution, in accordance with one or more aspects of the present invention.

By way of further example, multilayer structure 100, including n⁺ substrate 102 and n⁻ epi layer 104, may be mounted to a carrier substrate 112, such as depicted in the electrochemical process assembly of FIG. 2. As illustrated, carrier substrate 112, which may include or be fabricated of a non-conducting metal such as, for instance, indium, or the like, may be positioned on a pedestal 114 (e.g., metal substrate such as, a brass substrate) and introduced into electrochemical cell 106 so that multilayer structure 100 is immersed or at least partially submerged within electrolytic solution 107. Assuming that the semiconductor layers are an $n^+$ silicon carbide substrate and $n^-$ silicon carbide epi-layer, then in one example, the electrolytic solution may include about 10 mL of inorganic acid, such as, HCl, in about 90 mL of oxidizing species such as, hydrogen peroxide ($H_2O_2$). Additionally, care may be taken to protect any exposed surfaces from undesirable etching during the electrochemical processing by, for instance, encapsulating pedestal 114 within an inert protection material 116 such as, for instance, a wax or other suitable protection material.

As noted, the depicted multilayer structure may be electrically connected to conducting electrode 108 using, for instance, power supply 110 to bias the multilayer structure, and in particular, $n^+$ substrate 102 to a desired bias voltage with respect to conducting electrode 108 so that $n^+$ substrate 102 may be anodically oxidized and etched as described herein. In one embodiment, upon applying a desired current density, the electrochemical processing of the multilayer structure results in anodically oxidizing exposed surfaces of $n^+$ substrate 102, which continues to proceed towards $n^-$ epi layer 104, terminating at the interface of $n^+$ substrate 102 and $n^-$ epi layer 104, without changing and/or effecting porosity of the $n^-$ epi layer 104. As evidenced by the current density-voltage profile depicted in FIG. 3 (where the vertical axis represents current density ($A/Cm^2$), and the horizontal axis applied voltage (V)), upon establishing an appropriate current density (for instance, about 0.1 Amps or 0.2 Amps), the multilayer structure undergoes anodic oxidation, resulting in oxidizing and etching of porous $n^+$ substrate 102. In FIG. 3, curve A depicts current density applied initially through the electrolytic solution, and curve B depicts current density decreasing significantly, for instance, approaching zero, after $n^+$ substrate 102 has been consumed, indicating that the etching process is self-limiting at the interface of $n^+$ substrate 102 and $n^-$ epi layer 104, and that increasing porosity of the $n^+$ substrate 102 is a function of the current density applied through the electrolytic solution.

By way of example, FIGS. 4A-4G depict one embodiment of a process for fabricating a semiconductor structure comprising a multilayer semiconductor device, such as a p-i-n diode, utilizing (in part) the processing described herein.

Referring to FIG. 4A, a multilayer structure 400 is illustrated initially similar or identical to structure 100 of FIG. 1A of the above-described processing flow. Briefly, structure 400 includes $n^+$ substrate 102, and $n^-$ epi layer 104. As noted, $n^+$ substrate 102 and $n^-$ epi layer 104 may be or include semiconductor materials, such as described above in connection with FIGS. 1A-1C. By way of example, $n^+$ substrate 102 may be or include a semiconductor layer (e.g., silicon carbide) that has been doped with n-type dopants to create an $n^+$ silicon carbide layer. In a specific example, the concentration of n-type dopants implanted within $n^+$ substrate 102 may be about $10^{17}$ atoms/cm$^3$, or greater. Further, $n^-$ epi layer 104 may include or be fabricated of a semiconductor layer (e.g., silicon carbide) that has been epitaxially grown and less doped with, for instance, n-type dopants to create a lower-conducting, $n^-$ semiconductor layer. For example, the $n^-$ epi layer 104 may, for instance, be epitaxially grown or deposited over $n^+$ substrate 102, and the concentration of n-type dopants implanted therein may be about $10^{16}$ atoms/cm$^3$ or less, as described above in connection with FIGS. 1A-1C.

FIG. 4B illustrates the multilayer structure of FIG. 4A, with a multilayer semiconductor device 410 having been provided over $n^-$ epi layer 104. In one example, multilayer semiconductor device 410 may be a p-i-n diode, and may include one or more semiconductor layers with different conductivities and/or dopants separated by an undoped and/or low-conducting semiconductor layer to form the p-i-n diode structure. As depicted, multilayer semiconductor device 410 may include, for instance, an Ohmic contact layer 412, a drift layer 414 disposed over Ohmic contact layer 412, and an Ohmic contact layer 416 disposed over drift layer 414. The materials of the layers of multilayer semiconductor device 410 may be similar or identical to the materials of n+ substrate 102 and $n^-$ epi layer 104, and may be formed (for example) by various epitaxial growth processes such as, molecular beam epitaxy (MBE), ultra-high vacuum chemical vapor deposition (UHV-CVD) or the like. The thicknesses of the depicted layers 412, 414, 416 may vary, depending on the fabrication processes employed and the desired functionality of the resultant diode. Note that, in one example, $n^-$ epi layer 104 may advantageously serve as a stop layer which facilitates protecting the one or more high-conducting semiconductor layers 412, 416 of the p-i-n diode from being etched during the electrochemical etch processing described herein.

In one or more specific embodiments, Ohmic contact layer 412, which, for instance, may include or be fabricated of a wide-bandgap semiconductor material (e.g., silicon carbide (SiC), gallium nitride (GaN)), may be epitaxially grown or deposited over $n^-$ epi layer 104, and implanted with n-type dopant(s) to create a high-conducting $n^+$ Ohmic contact layer 412. Drift layer 414 may be epitaxially grown or deposited over Ohmic contact layer 412. As understood, the drift layer serves as the drift region for the p-i-n diode, and therefore may be lightly doped with dopants, for instance, n-type dopants and/or p-type dopants, relative to Ohmic contact layers 412, 416. Alternatively, drift layer 414 can be an intrinsic region of the p-i-n diode structure, and therefore may be substantially undoped or an unintentionally doped semiconductor layer. Further, Ohmic contact layer 416, which, for instance, has conductivity different than the conductivity of Ohmic contact layer 412, may be epitaxially grown or deposited over drift layer 414. By way of example, and as noted, Ohmic contact layer 412 may be implanted with n-type dopants, while the Ohmic contact layer 416 may be doped with p-type dopants, or vice versa.

FIG. 4C illustrates the semiconductor structure of FIG. 4B after a contact layer 418 has been provided over multilayer semiconductor device 410. Contact layer 418 serves as an Ohmic contact to Ohmic contact layer 416, and may include or be fabricated of a metal such as, for instance, tantalum, tungsten or combinations or alloys thereof In one embodiment, contact layer 418 may be formed using one or more processing techniques such as sputtering, evaporation or the like.

In one or more implementations, multilayer structure 400 is inverted and mounted to a support substrate 422 using, for instance, an appropriate bonding material 420. By way of example, support substrate 422 may be a metal substrate fabricated, for instance, of brass, copper, aluminum, or a metal alloy, such as aluminum nitride (AlN), etc., and bonding material 420 may be, for instance, a bonding metal such as indium, which facilitates bonding support substrate 422 to contact layer 418.

As disclosed herein, multilayer structure 400, and in particular, $n^+$ substrate 102, is subjected to electrochemical processing to anodically oxidize the $n^+$ substrate within an electrolyte solution disposed within an electrochemical cell, as described above. As noted, the electrochemical processing advantageously facilitates selectively increasing porosity of the $n^+$ substrate 102 by anodic oxidation, which facilitates removing the $n^+$ substrate 102 from the multilayer structure, producing a porous $n^+$ substrate 102' (depicted in FIG. 4E), as well as the remaining multilayer structure 400 illustrated. Note that, in one example, $n^-$ epi layer 104 operates as an etch stop layer during the electrochemical processing and facilitates protecting the higher-conducting semiconductor layers of the multilayer semiconductor device 410. As noted, the porous $n^+$ substrate 102' may advantageously be reused for other applications, such as, for instance, fabricating highly efficient gas sensors, molecular filters, and/or electrodes for electron beam emitters, if desired.

As shown in FIG. 4F, the $n^-$ epi layer 104 (FIG. 4E) may be removed, leaving the illustrated free-standing multilayer device structure. By way of example, the $n^-$ epi layer may be removed employing chemical-mechanical polishing, or one or more etch processes, such as reactive ion etching (RIE) using (in one embodiment) Ohmic contact layer 412 of multilayer semiconductor device 410 as an etch stop. One or more lithographic processes may subsequently be performed to pattern the exposed Ohmic contact layer 412, and to form a contact structure 424 thereover, as depicted in FIG. 4G. Contact structure 424 may serve as an Ohmic contact to Ohmic contact layer 412, and may include or be fabricated of a metal such as, for instance, tantalum, tungsten or combinations or alloys thereof By way of further example, FIGS. 5A-5F depict one embodiment of a process for fabricating a semiconductor structure comprising a multilayer semiconductor device, such as a Schottky diode, utilizing (in part) the processing described herein.

Referring to FIG. 5A, a multilayer structure 500 is illustrated initially similar or identical to structure 100 of FIG. 1A of the above-described processing flow. Briefly, structure 500 includes $n^+$ substrate 102, and $n^-$ epi layer 104 disposed thereover. As noted, $n^+$ substrate 102 and $n^-$ epi layer 104 may be or include semiconductor materials, such as described above in connection with FIGS. 1A-1C. By way of example, $n^+$ substrate 102 may be or include a semiconductor layer (such as silicon carbide) that has been doped with n-type dopants to create an $n^+$ silicon carbide layer. In a specific example, the concentration of n-type dopants implanted within $n^+$ substrate 102 may be about $10^{17}$ atoms/$cm^3$, or greater. Further, $n^-$ epi layer 104 may include or be fabricated of a semiconductor layer (e.g., silicon carbide) that has been epitaxially grown and less doped with, for instance, n-type dopants to create the lower-conducting, $n^-$ semiconductor layer. For example, the $n^-$ epi layer 104 may, for instance, be epitaxially grown or deposited over $n^+$ substrate 102, and the concentration of n-type dopants implanted therein may be about $10^{16}$ atoms/$cm^3$ or less, as described above in connection with FIGS. 1A-1C.

As illustrated in FIG. 5B, an additional semiconductor layer 512 may optionally be epitaxially grown or deposited over $n^-$ epi layer 104 to facilitate, for instance, defining a multilayer semiconductor device 510, such as a Schottky diode. The material of semiconductor layer 512 may be similar or identical to the material of $n^-$ epi layer 104, and the layer may be formed (for example) by various epitaxial growth processes, for instance, MBE, UHV-CVD or the like. Further, note that (in one or more embodiments) semiconductor layer 512 may be implanted with, for instance, n-type dopants to create a high-conducting $n^+$ epi layer, with a conductivity substantially greater than the conductivity of $n^-$ epi layer 104. Note also that, in this example, the multilayer semiconductor device 510 includes $n^-$ epi layer 104 as part of the device.

FIG. 5C illustrates multilayer structure 500 of FIG. 5B after providing a contact layer 514 over multilayer semiconductor device 510. Contact layer 514 may serve as an Ohmic contact to semiconductor layer 512, and may include or be fabricated of a metal such as, for instance, tantalum, tungsten or combinations or alloys thereof. In one embodiment, contact layer 514 may be formed using one or more processing techniques such as sputtering, evaporation or the like.

Similar to the processing described above in connection with FIGS. 4A-4G, multilayer structure 500 may be inverted and mounted to a support substrate 422 via, for instance, an appropriate bonding material 420. In one or more implementations, support substrate 422 may comprise a metal substrate, such as a brass, copper, aluminum substrate, or a metal alloy substrate, such as an aluminum nitride substrate, and bonding material 420 may comprise, for instance, a non-conducting metal such as indium, which bonds support substrate 422 to contact layer 514 of the semiconductor structure.

Once the structure is bonded to support substrate 422, electrochemical processing may be employed to, at least in part, anodically oxidize $n^+$ substrate 102 within an electrolytic solution, such as described above in connection with FIGS. 1A-1C. The anodically oxidizing of $n^+$ substrate 102 results in selectively increasing porosity thereof, which in turn, facilitates removing the porous $n^+$ substrate 102' (FIG. 5E) from the multilayer structure 500.

As illustrated in FIG. 5F, a Schottky contact 520 may optionally be formed over exposed $n^-$ epi layer 104 to, for instance, maximize reverse blocking voltage and minimize forward voltage drop of the resultant Schottky diode. Schottky contact layer 520 forms a metal-to-semiconductor interface with the low-conducting $n^-$ epi layer 104, resulting in a Schottky junction. Schottky contact 520 may include or be fabricated of one or more low-work function metals such as, aluminum (Al), titanium (Ti), molybdenum (Mo) or gold (Au).

By way of example, FIGS. 6A-6C depict an alternate embodiment of a process of selectively increasing porosity of a semiconductor layer to facilitate separating a semiconductor substrate and an epitaxially-grown layer, in accordance with one or more aspects of the present invention.

Referring to FIG. 6A, one embodiment of a multilayer structure, generally denoted 600, is depicted, which may be used, for instance, in a fabrication process for a high-voltage power device, such as described herein. As illustrated, multilayer structure 600 includes a semiconductor substrate 601, such as a bulk semiconductor material; for example, a bulk silicon wafer. As another example, semiconductor substrate 601 may include any silicon-containing substrate including, but not limited to, single crystal Si, polycrystalline Si, amorphous Si substrate, and the like, and may be lightly-doped n-type or p-type material, as desired for a particular application.

As shown, multilayer structure 600 further includes a thin $n^+$ layer 102, and a lower-conducting $n^-$ epi layer 104 disposed thereover. As noted, $n^+$ layer 102 and $n^-$ epi layer 104 may be or include semiconductor materials, such as described above in connection with FIGS. 1A-1C. By way of example, $n^+$ layer 102 may be or include a semiconductor layer (such as silicon carbide or gallium nitride), and may be epitaxially grown or deposited over semiconductor substrate

601. Although the thickness of n+ layer 102 may depend on the fabrication process employed and the desired functionality, in one example, n+ layer 102 may be formed as a thin semiconductor layer, with a thickness within a range of about 10 to 30 μm (to facilitate current flow to the edge(s) of the wafer layer). In one example, the concentration of n-type dopants implanted within n+ layer 102 may be about $10^{17}$ atoms/cm$^3$, or greater. Further, n− epi layer 104 may include or be fabricated of a semiconductor layer (e.g., silicon carbide or gallium nitride) that has been epitaxially grown and less doped with, for instance, n-type dopants to create the lower-conducting, n− semiconductor layer. For example, the n− epi layer 104 may, for instance, be epitaxially grown or deposited over n+ layer 102, and the concentration of n-type dopants implanted therein may be about $10^{16}$ atoms/cm$^3$ or less, as described above in connection with FIGS. 1A-1C.

As illustrated in FIG. 6B, multilayer structure 600 may be subjected to electrochemical processing, as described herein, utilizing, in part, an electrolytic solution disposed within an electrochemical cell as described above. By way of example, electrochemical processing of the multilayer structure advantageously facilitates selectively anodically oxidizing n+ layer 102, selectively increasing porosity thereof, as described. This selectively increased porosity, in turn, facilitates separating semiconductor substrate 601 and n− epi layer 104 (as depicted in FIG. 6C) from the multilayer structure along their respective interfaces with n+ layer 102 (FIG. 6B). Note that, in one or more implementations, the thickness of n+ layer 102 may be sufficiently thin so that the resultant oxidized porous layer may not be recovered for further use, with the separated layer being dissolved within electrolytic solution 107. As discussed, the rate of anodic oxidation of n+ layer 102 may depend on process parameters such as, current density applied and/or oxidizing time, and if desired, the process parameters may be selected or prolonged to completely oxidize n+ layer 102 sandwiched between semiconductor substrate 601 and n− epi layer 104. Advantageously, with this process, semiconductor substrate 601 may be reused for additional, repeated epitaxial growth processes.

By way of example, FIGS. 7A-7F depict one embodiment of a process for fabricating a semicondcutor structure, such as a Schottky diode, using, in part, the processing described above in connection with FIGS. 6A-6C. Note in this regard that, although FIGS. 7A-7F depict one example of fabricating a Schottky diode, the processing described may be employed by one skilled in the art to fabricate other multilayer semiconductor devices including, for instance, other diode structures such as a p-i-n diode, or transistor structures, such as an IGBT or BJT. The exemplary process depicted in FIGS. 7A-7F for fabricating a Schottky diode is presented by way of example only.

Referring to FIG. 7A, a multilayer structure 700 is illustrated initially similar or identical to multilayer structure 600 of FIG. 6A. Briefly, multilayer structure 700 includes semiconductor substrate 601, thin n+ layer 102 disposed over semiconductor substrate 601, and n− epi layer 104 disposed over n+ layer 102. As noted, the materials of the depicted layers may be or include semiconductor materials, such as described above in connection with FIG. 6A.

A multilayer semiconductor device 710 may be formed by providing an additional semiconductor layer 712 over n− epi layer 104. This additional semiconductor layer 712 may optionally be epitaxially grown or deposited over n− epi layer 104 to facilitate defining, for instance, a Schottky diode. The material of semiconductor layer 712 may be similar or identical to the material of semiconductor layer 512 (FIG. 5B), and may be formed using any of the deposition processes described above. Semiconductor layer 712 and n− epi layer 104, together define one example of a multilayer semiconductor device 710. Where desired, semiconductor layer 712 may comprise, for instance, n-type dopants, which create a high-conducting, n+ epi layer, with a conductivity that is substantially greater than the conductivity of n− epi layer 104.

FIG. 7C illustrates the multilayer structure of FIG. 7B, after providing a contact layer 712 over multilayer semiconductor device 710. Contact layer 714 may, for instance, serve an Ohmic contact to semiconductor layer 712, may be similar to the material of contact layer 514 (FIG. 5C), and may be formed using, for instance, one of the deposition processes noted above for contact layer 514.

As illustrated in FIG. 7D, similar to the processing described above, multilayer structure 700 may be inverted and mounted to a support substrate 422 using, for instance, a bonding material 420, such as described above. In one or more implementations, support substrate 422 may include or be fabricated of a metal, such as brass, copper, aluminum, or a metal alloy, such as aluminum nitride (AlN). Bonding material 420 may be a bonding metal, such as a non-conducting bonding metal, for instance, indium.

With support substrate 422 attached to the multilayer structure, electrochemical processing may be employed to selectively increase porosity of n+ layer 102 to facilitate separating semiconductor substrate 601 from the multilayer structure 700, as illustrated in FIG. 7E, and as described above in connection with FIGS. 6A-6C. As noted, the thickness of n+ layer 102 may be selected to be sufficiently thin so that once oxidized, the porous layer may be dissolved within the electrolytic solution during the electrochemical processing.

If desired, a Schottky contact 720 (FIG. 7F) may optionally be formed over exposed n− epi layer 104 to, for instance, maximize reverse blocking voltage and minimize forward voltage drop of the resultant Schottky diode. The material and formation process of Schottky contact 720 may be similar to the material and formation process of Schottky contact 520, described above with respect to FIG. 5F.

By way of additional example, FIGS. 8A-8C depict one embodiment of a process for selectively increasing porosity of a semiconductor substrate to facilitate partially thinning the semiconductor substrate, in accordance with one or more aspects of the present invention.

Referring to FIG. 8A, a multilayer structure 800 is illustrated similar or identical to structure 100 of FIG. 1A described above. Briefly, multilayer structure 800 includes n+ substrate 102, and n− epi layer 104 disposed thereover. As noted, n+ substrate 102 and n− epi layer 104 may be or include semiconductor materials, such as described above in connection with FIGS. 1A-1C. By way of example, n+ substrate 102 may be or include a semiconductor layer or wafer such as, for instance, a silicon carbide substrate, which has been doped with n-type dopants to create an n+ silicon carbide layer substrate. In a specific example, the concentration of n-type dopants within n+ substrate 102 may be about $10^{17}$ atoms/cm$^3$, or greater Further, n− epi layer 104 may include or be fabricated of a semiconductor layer (e.g., silicon carbide) that has been epitaxially grown and less doped with, for instance, n-type dopants to create a low-conducting, n− semiconductor layer. For example, the n− epi layer 104 may, for instance, be epitaxially grown or deposited over n+ substrate 102, and the concentration of n-type dopants implanted therein may be about $10^{16}$ atoms/cm$^3$ or less, as described above in connection with FIGS. 1A-1C.

As described above, and as illustrated in FIG. 8B, multilayer structure 800, and in particular, n$^+$ substrate 102, is subjected to electrochemical processing to anodically oxidize n$^+$ substrate 102 within the electrolyte solution. Note that, in one or more embodiments, the process parameters employed during this electrochemical processing may be modulated so that the increase in porosity of n$^+$ substrate 102 is controlled to a desired thickness, which is used to only partially remove or thin n$^+$ substrate 102 from n$^-$ epi layer 104. For instance, the electromechanical process may be modulated by increasing the current density after a defined or desired amount of n$^+$ substrate 102 has oxidized or increased in porosity. The increased current density may result in the porous or oxidized layer dislodging, leaving the un-oxidized, thinned n$^+$ substrate 102 attached to n$^-$ epilayer 104, as depicted in FIG. 8C. Although the reduced thickness of thinned n$^+$ substrate may vary, depending on the desired functionality, in one example, the thickness of n$^+$ substrate 102 may be reduced by about 50% to 90%. Furthermore, as described above, the removed porous portion of n$^+$ substrate 102 may advantageously be reused for other applications.

By way of example, FIGS. 9A-9D depict one embodiment of a process for fabricating a semiconductor structure, such as a p-i-n diode, utilizing (in part) the above-described processing of FIGS. 8A-8C. Note that the example of FIGS. 9A-9D is provided by way of example only. Other multilayer device structures may be fabricated using the processing concepts disclosed above, as described herein.

As illustrated in these figures, a variation of the thinning process of FIGS. 8A-8C may be employed, where semiconductor structure 900 includes an n$^+$ substrate 102, such as described above, with a multilayer semiconductor device 910 disposed directly on n$^+$ substrate 102. That is, in this example, the second semiconductor layer (104) of the examples discussed above may be omitted since a portion of the n$^+$ substrate 102 remains within the final structure, and thus, protects the multilayer semiconductor device 910 from etching during the electrochemical processing.

By way of example, the semiconductor layer (or n$^+$ substrate) 102 may be a bulk semiconductor material. For instance, semiconductor layer 102 may be or include a wide-bandgap semiconductor material such as, a III-V and/or II-VI semiconductor compound (e.g., silicon carbide, gallium nitride), and may be doped with n-type dopant or p-type dopant. As depicted, semiconductor layer 102 may be implanted with n-type dopants to create a highly-conducting, n$^+$ semiconductor layer or substrate 102 (i.e., an n$^+$ substrate 102). By way of example, the concentration of n-type dopants implanted within n$^+$ substrate 102 may be about $10^{17}$ atoms/cm$^3$, or greater.

As noted, multilayer semiconductor device 910 defines, by way of example, a p-i-n diode. The multiple layers of multilayer semiconductor device 910 may be similar or identical to the layers of the multilayer semiconductor device 410 described above in connection with FIG. 4B. For instance, multilayer semiconductor device 910 may include one or more semiconductor layers with different conductivities and/or dopants (which, for instance, serve as Ohmic contact layers), separated by an undoped and/or lower-conducting semiconductor layer, to form the p-i-n diode structure. In one example, multilayer semiconductor device 910 may include an Ohmic contact layer 912, a drift layer 914 disposed over Ohmic contact layer 912, and an Ohmic contact layer 916 disposed over drift layer 914. In one example, Ohmic contact layer 912 may be heavily implanted with n-type dopants, and Ohmic contact layer 916 may be heavily implanted with p-type dopants, or vice versa. Additionally, drift layer 914 may be either lightly doped to serve as a drift region, or may remain undoped to serve as an intrinsic region.

FIG. 9B illustrates the structure of FIG. 9A after providing a contact layer 918 over multilayer semiconductor device 910. Contact layer 918 may include or be fabricated of a metal such as, for instance, tantalum, tungsten or combinations or alloys thereof In one embodiment, contact layer 918 may be formed using one or more processing techniques such as sputtering, evaporation or the like.

As shown in FIG. 9C, multilayer structure 900 may be subjected to electrochemical processing to anodically oxidize the n$^+$ substrate 102 within an electrolyte solution, as described above. As noted, the electrochemical processing advantageously facilitates selectively increasing porosity of n$^+$ substrate 102 by anodic oxidation, which facilitates selective removal of a portion of the n$^+$ substrate 102 from multilayer structure 900. Note that, in this embodiment, the process parameters employed during the electrochemical processing are modulated so that the increased porosity of n$^+$ substrate 102 is controlled to a desired thickness, to only partially remove or thin n$^+$ substrate 102. This, in turn, leaves multilayer semiconductor device 910 above a thinned n$^+$ substrate 102 of reduced thickness, as depicted in FIG. 9C. Advantageously, as described above, the removed, porous n$^+$ substrate 102' may be reused for other applications, if desired.

One or more lithographic processes may be performed to pattern contact layer 918 of multilayer semiconductor device 910, as depicted in FIG. 9D, and an Ohmic contact 920 may be added to the thinned n$^+$ substrate 102 to facilitate electrical connection to the multilayer semiconductor device. Contact layers 918, 920 may serve as Ohmic contacts, and include or be fabricated of an n-doped or p-doped, respectively, metal such as, for instance, tantalum, tungsten or combinations or alloys thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a multilayer structure comprising a first semiconductor layer and a second semiconductor layer, the first semiconductor layer and the second semiconductor layer each comprising silicon carbide or a silicon carbide alloy, the first semiconductor layer comprising a higher concentration of a dopant and a higher conductivity than the second semiconductor layer, the first semiconductor layer being an n+layer,;
   selectively increasing, by electrochemical processing the first semiconductor layer within an electrolytic solution comprising an inorganic acid and an oxidizing species, porosity of the first semiconductor layer, at least in part, the selectively increasing porosity utilizing the higher conductivity of the first semiconductor layer; and
   removing, at least in part, the first semiconductor layer with the selectively increased porosity from the multilayer structure.

2. The method of claim 1, wherein the selectively increasing porosity comprises selectively anodically oxidizing, at least in part, the first semiconductor layer.

3. The method of claim 2, wherein the electrochemically processing selectively anodically oxidizes, at least in part, the first semiconductor layer, the higher concentration of dopant of the first semiconductor layer enhancing the anodically oxidizing thereof to selectively increase the porosity of the first semiconductor layer and facilitate the removing, at least in part, of the first semiconductor layer from the multilayer structure.

4. The method of claim 3, wherein the electrochemically processing comprises controlling a current density applied through the electrolytic solution and the first semiconductor layer, the selectively increasing porosity being, at least in part, a function of the current density applied.

5. The method of claim 2, wherein the providing comprises epitaxially growing the second semiconductor layer over the first semiconductor layer prior to the selectively increasing porosity of the first semiconductor layer.

6. The method of claim 5, wherein the first semiconductor layer and the second semiconductor layer each comprise a wide-bandgap semiconductor material.

7. The method of claim 5, wherein the anodically oxidizing of the first semiconductor layer utilizing the greater conductivity of the first semiconductor layer to selectively increase porosity of the first semiconductor layer, at least in part, without increasing porosity of the second semiconductor layer.

8. The method of claim 7, wherein the first conductivity of the first semiconductor layer is ten times greater or more than the second conductivity of the second semiconductor layer.

9. The method of claim 1, wherein the providing comprises providing the first semiconductor layer and the second semiconductor layer as a semiconductor substrate of the multilayer structure, the selectively increasing porosity facilitating removing, at least in part, the first semiconductor layer of the semiconductor substrate.

10. The method of claim 9, wherein the providing the multilayer structure further comprises providing a multilayer semiconductor device above the first semiconductor layer and the second semiconductor layer prior to the selectively increasing porosity of the first semiconductor layer.

11. The method of claim 10, wherein the multilayer semiconductor device comprises a p-i-n diode.

12. The method of claim 10, wherein the multilayer semiconductor device comprises a Schottky diode.

13. The method of claim 1, wherein the providing the multilayer structure comprises providing the first semiconductor layer and the second semiconductor layer above a semiconductor substrate, the selectively increasing porosity and the removing, at least in part, the first semiconductor layer, facilitating removing the semiconductor substrate from the multilayer structure.

14. The method of claim 13, wherein the providing the multilayer structure further comprises providing a multilayer semiconductor device above the first semiconductor layer and the second semiconductor layer prior to the selectively increasing porosity of the first semiconductor layer.

15. The method of claim 14, further comprising bonding the multilayer structure to a support substrate prior to the removing of the semiconductor substrate of the multilayer structure.

16. The method of claim 1, wherein the removing comprises only partially removing the first semiconductor layer from the multilayer structure, leaving the thinned first semiconductor layer as part of the multilayer structure.

17. The method of claim 16, wherein the providing the multilayer structure further comprises providing a multilayer semiconductor device above the first semiconductor layer and the second semiconductor layer.

18. The method of claim 16, wherein the providing comprises providing the first semiconductor layer and the second semiconductor layer as a semiconductor substrate of the multilayer structure, the thinned first semiconductor layer being a thinned semiconductor substrate of the multilayer structure.

* * * * *